(12) United States Patent
Arase et al.

(10) Patent No.: US 9,887,070 B2
(45) Date of Patent: Feb. 6, 2018

(54) PLASMA PROCESSING APPARATUS AND PLASMA PROCESSING METHOD

(71) Applicant: HITACHI HIGH-TECHNOLOGIES CORPORATION, Tokyo (JP)

(72) Inventors: Takao Arase, Tokyo (JP); Masahito Mori, Tokyo (JP); Kenetsu Yokogawa, Tokyo (JP); Yuusuke Takegawa, Tokyo (JP); Takamasa Ichino, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/671,381

(22) Filed: Aug. 8, 2017

(65) Prior Publication Data

US 2017/0338086 A1 Nov. 23, 2017

Related U.S. Application Data

(62) Division of application No. 14/972,286, filed on Dec. 17, 2015, now Pat. No. 9,779,919.

(30) Foreign Application Priority Data

Jan. 9, 2015 (JP) .................................. 2015-002723
Oct. 9, 2015 (JP) .................................. 2015-200701

(51) Int. Cl.
*H01L 21/00* (2006.01)
*H01J 37/32* (2006.01)
(Continued)

(52) U.S. Cl.
CPC .. *H01J 37/32935* (2013.01); *H01J 37/32082* (2013.01); *H01J 37/32706* (2013.01);
(Continued)

(58) Field of Classification Search
CPC ........... H01L 21/3065; H01L 21/31116; H01L 21/67069; H01L 21/6831
See application file for complete search history.

(56) References Cited

U.S. PATENT DOCUMENTS 5,997,687 A 12/1999 Koshimizu
7,224,568 B2 5/2007 Ishimura et al.
(Continued)

FOREIGN PATENT DOCUMENTS

JP 2006-210726 A 8/2006
JP 2008-034669 A 2/2008
(Continued)

OTHER PUBLICATIONS

Notification of Reason for Refusal, dated Jan. 16, 2017, which issued during the prosecution of Korean Patent Application No. 10-2015-0187518, which corresponds to the present application (English translation attached).

*Primary Examiner* — Zandra Smith
*Assistant Examiner* — John M Parker
(74) *Attorney, Agent, or Firm* — Baker Botts L.L.P.

(57) ABSTRACT

To control temperature of a sample in plasma processing with high accuracy while securing an electrostatic chucking force 5 without breakdown of an electrostatic chucking film. When radio-frequency power is time modulated, a high-voltage side Vpp detector detects a first voltage value which is a peak-to-peak voltage value of a radio-frequency voltage applied to a sample stage in a first period of the time modulation having a 10 first amplitude. A low-voltage side Vpp detector detects a second voltage value which is a peak-to-peak voltage value of a radio-frequency voltage applied to the sample stage in a second period having a second amplitude smaller than the first amplitude. Then, an ESC power supply control unit controls output voltages (Continued)

from 15 ESC power supplies based on the first voltage value, the second voltage value and a duty ratio of the time modulation.

6 Claims, 7 Drawing Sheets

(51) Int. Cl.
*H01L 21/67* (2006.01)
*H01L 21/683* (2006.01)

(52) U.S. Cl.
CPC .. *H01J 37/32715* (2013.01); *H01L 21/67248* (2013.01); *H01L 21/6833* (2013.01); *H01L 21/6831* (2013.01)

(56) References Cited

U.S. PATENT DOCUMENTS

| | | |
|---|---|---|
| 8,329,054 B2 | 12/2012 | Ichino et al. |
| 8,801,951 B2 | 8/2014 | Inoue et al. |
| 9,336,999 B2 | 5/2016 | Morimoto et al. |
| 2008/0023139 A1 | 1/2008 | Yasui et al. |
| 2008/0110859 A1 | 5/2008 | Koshiishi et al. |
| 2013/0114181 A1* | 5/2013 | Drewery ............ H01L 21/6833 361/234 |
| 2016/0233057 A1 | 8/2016 | Morimoto et al. |

FOREIGN PATENT DOCUMENTS

| | | |
|---|---|---|
| JP | 2010-010236 A | 1/2010 |
| JP | 2011-061048 A | 3/2011 |
| JP | 2013-012624 A | 1/2013 |
| KR | 2014-0143316 A | 12/2014 |

\* cited by examiner

PLASMA PROCESSING APPARATUS AND PLASMA PROCESSING METHOD

CROSS-REFERENCE TO RELATED APPLICATION

The present application is a division of U.S. patent application Ser. No. 14/972,286 filed on Dec. 17, 2015, which claims benefit of priority to Japanese Patent Application No. 2015-002723 filed on Jan. 9, 2015 and Japanese Patent Application No. 2015-200701 filed on Oct. 9, 2015, the contents of all of which are hereby incorporated by reference into this application.

TECHNICAL FIELD OF THE INVENTION

The present invention relates to a plasma processing apparatus and a plasma processing method, and particularly to a technique which is effective for control of damage on an electrode of a plasma processing apparatus caused by increase of plasma potential.

BACKGROUND OF THE INVENTION

A structure in which a semiconductor wafer is electrostatically chucked, and helium gas is caused to flow between the semiconductor wafer and en electrode has been widely used as a technique for accurately securing temperature of the semiconductor wafer in a plasma processing apparatus such as a plasma etching apparatus.

Two systems of unipolar (monopole) and bipolar (dipole) systems, for example, are mainly used as an electrostatic chuck system. A unipolar system applies an electrostatic chucking voltage to one electrode, and a bipolar system is provided with two or more electrodes and applies electrostatic chucking voltages having different polarities.

The electrostatic chuck is implemented by applying a DC voltage between an electrode and a semiconductor wafer with a thin insulating film, formed using ceramic or the like, interposed therebetween. In addition, a high voltage is applied to the semiconductor wafer in order to allow ions from plasma to be accelerated and incident.

Japanese Patent Application Laid-Open Publication No. 2006-210726 (Patent Document 1) discloses a method of monitoring a radio-frequency voltage which is being applied to an electrode, and controlling an output voltage of a power supply for electrostatic chuck (ESC) based on a monitored radio-frequency voltage signal, thereby keeping a voltage to be applied at the electrostatic chuck in a desired value.

In addition, Japanese Patent Application Laid-Open Publication No. 2013-12624 (Patent Document 2) discloses a technique of alternately applying two types of voltages, that is, applying a high voltage and a low voltage of a radio-frequency voltage to a semiconductor wafer, and performing etching by setting a time ratio (TM duty) of high power and a repetition frequency. At this time, Patent Document 2 discloses that a value at the time of high power is a stable value as a peak value of the radio-frequency bias voltage to be applied to the wafer to be monitored.

Further, Japanese Patent Application Laid-Open Publication No. 2010-10236 (Patent Document 3) discloses a technique regarding control of an output voltage of a power supply for electrostatic chuck in a case in which a radio-frequency bias voltage, which is not time modulated, is applied to an electrode in a plasma processing apparatus.

SUMMARY OF THE INVENTION

An examination has been conducted regarding a case in which a wafer bias of 2.5 kV or higher is applied using the method of controlling a DC current for the electrostatic chuck described in Patent Document 1 while alternately applying the two radio-frequency voltages of the high voltage and the low voltage, that is, using the etching technique described in Patent Document 2.

In this condition, a frequency of temporal change of helium back pressure of the semiconductor wafer increases with the duty being 40% or lower and 60% or higher. As a result, there is a risk of decrease in electrostatic chucking force and generation of voltage breakdown of an electrostatic chucking film.

In addition, the above-described techniques in the background of the invention do not include consideration on a technique of using a time modulation (TM) bias although performing a plasma etching process using a continuous wave (CW) bias.

An object of the present invention is to provide a technique which is capable of controlling temperature of a sample in plasma processing with high accuracy while securing an electrostatic chucking force without breakdown of an electrostatic chucking film.

The above and other objects and novel characteristics of the present invention will be apparent from the description of the present specification and the accompanying drawings.

The following is a brief description of an outline of the typical invention disclosed in the present application.

That is, a typical plasma processing apparatus includes a processing chamber, a first radio-frequency power supply, a sample stage, a first DC power supply, a second DC power supply, a second radio-frequency power supply, a voltage detection unit, and a power supply control unit.

A sample is subjected to plasma processing in the processing chamber. The first radio-frequency power supply supplies a radio-frequency power to generate plasma in the processing chamber.

The sample stage is provided with a first electrode and a second electrode, which are embedded in an electrostatic chucking film and cause the sample to be electrostatically chucked to the electrostatic chucking film, and the sample is placed on the sample stage. The first DC power supply applies a first DC voltage to the first electrode. The second DC power supply applies a second DC voltage to the second electrode.

A second radio-frequency power supply supplies a radio-frequency power to the sample stage. A voltage detection unit detects a first voltage value and a second voltage value from the radio-frequency power applied to the sample stage. A power supply control unit controls each set voltage of the first DC power supply and the second DC power supply.

The first voltage value, which is detected by the voltage detection unit, is a peak-to-peak voltage value of radio-frequency power applied to the sample stage, when the radio-frequency power supplied to the sample stage is time modulated, in a first period of the time modulation having a first amplitude.

The second voltage value, which is detected by the voltage detection unit, is a peak-to-peak voltage value of radio-frequency power applied to the sample stage in a second period of the time modulation having a second amplitude smaller than the first amplitude.

Also, the power supply control unit obtains a time averaged value of a peak-to-peak voltage value of a radio-frequency voltage applied to the sample stage based on the first voltage value, the second voltage value, and a duty ratio of the time modulation, obtains the first DC voltage and the second DC voltage using the obtained time averaged value and an electrostatic chucking voltage, which is a voltage that allows the sample to be electrostatically chucked to the electrostatic chucking film and is a potential difference between both ends of the electrostatic chucking film, and controls the first DC power supply and the second DC power supply so as to output the obtained first DC voltage and second DC voltage, respectively.

In particular, the power supply control unit determines whether a voltage exceeding an upper limit of a dielectric withstand voltage of the electrostatic chucking film is applied to the electrostatic chucking film, and outputs an alarm that promotes exchange of the electrostatic chucking film when the number of times determined as exceeding the upper limit of the dielectric withstand voltage is larger than a threshold value of the number of determinations set in advance.

Among the inventions disclosed in the application, the advantageous effects obtained by the representatives will be briefly explained as below.

It is possible to perform the plasma processing with high quality.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Further, in the embodiments described below, when referring to the number of elements (including number of pieces, values, amount, range, and the like), the number of the elements is not limited to a specific number unless otherwise stated or except the case where the number is apparently limited to a specific number in principle.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Further, members having the same function are denoted by the same reference symbols throughout all drawings for describing the embodiments, and the repetitive description thereof will be omitted. Note that hatching is used in some cases even in a plan view so as to make the drawings easy to see.

Hereinafter, embodiments will be described in detail.

<Configuration Example of Plasma Processing Apparatus>

Figure 1:
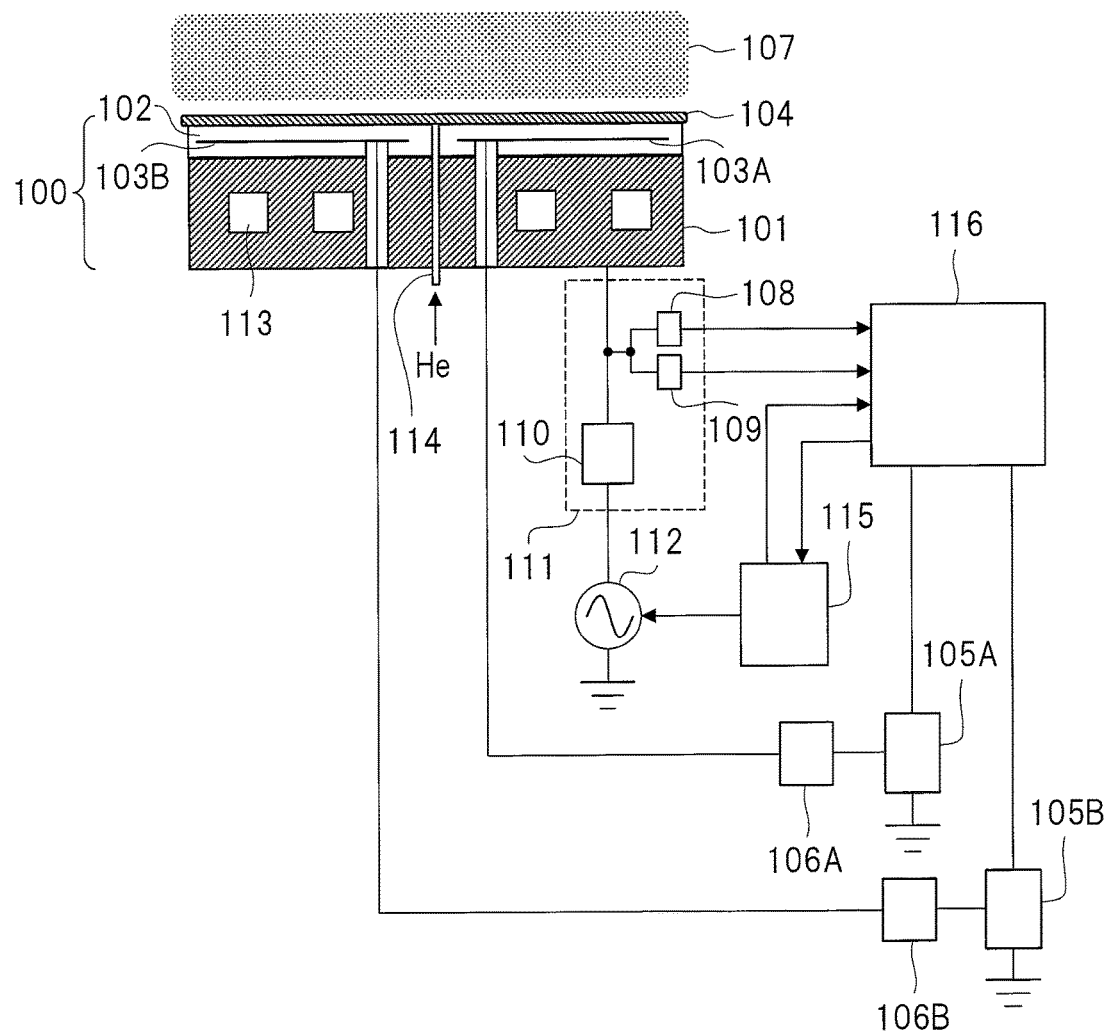
FIG. 1 is an explanatory diagram illustrating an example of a configuration of a main section in a plasma processing apparatus using a bipolar type electrode according to an embodiment.
Figure 7:
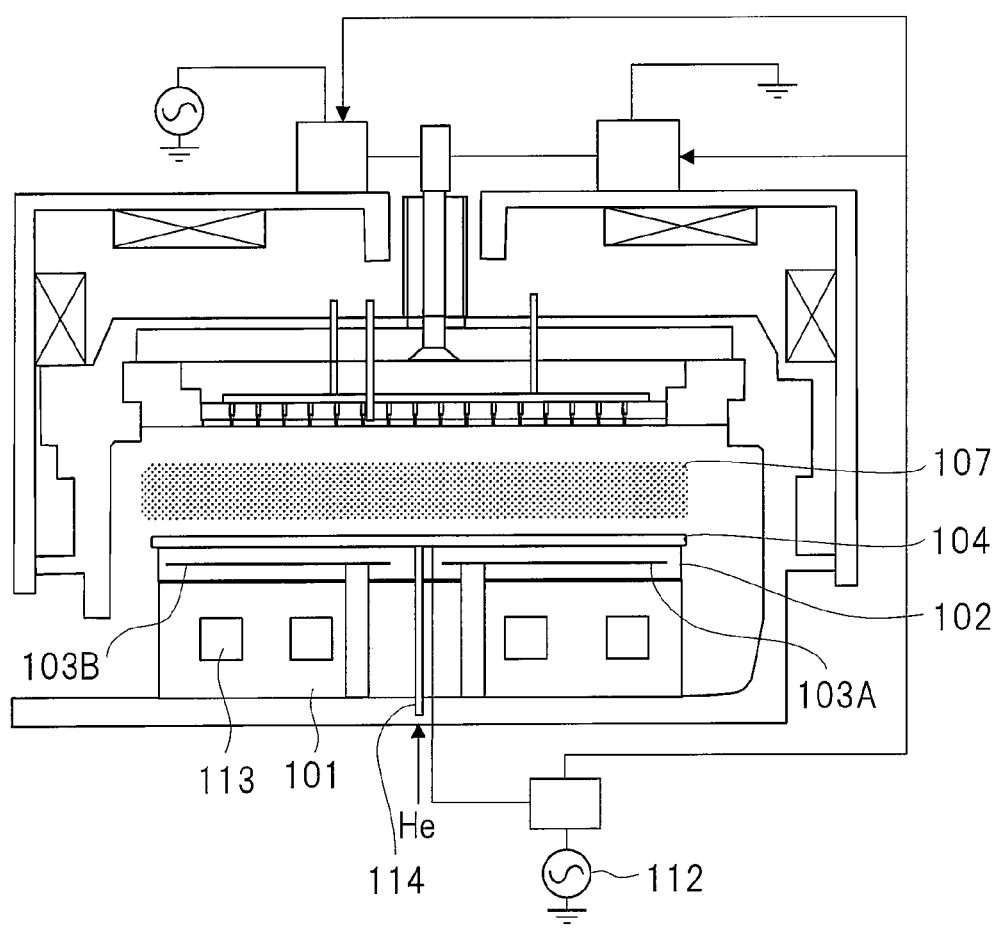
FIG. 7 is an explanatory diagram illustrating a schematic cross-section of a plasma processing apparatus according to an embodiment.

FIG. 1 is an explanatory diagram illustrating an example of a configuration of a main section in a plasma processing apparatus according to the present embodiment as illustrated in FIG. 7. FIG. 1 illustrates an unprocessed sample installation unit 100, which is included in the plasma processing apparatus, and each circuit unit to be connected to the unprocessed sample installation unit 100.

The plasma processing apparatus is provided with the unprocessed sample installation unit 100 which is a sample stage as illustrated in FIG. 1. The unprocessed sample installation unit 100 is provided in a processing chamber (not illustrated) in which an unprocessed sample 104 such as a semiconductor wafer, which will be described later, is subjected to plasma processing.

The unprocessed sample installation unit 100 includes a base material section 101, an electrostatic chucking film 102, and ESC electrodes 103A and 103B. The electrostatic chucking film 102 is placed on an upper part of the base material section 101 to which radio-frequency power is applied. This electrostatic chucking film 102 is formed using ceramic, for example. In addition, each of the ESC electrodes 103A and 103B is embedded in the electrostatic chucking film 102.

The ESC electrode 103A serving as a first electrode is disposed in the right side of FIG. 1, and the ESC electrode 103B serving as a second electrode is disposed in the left side thereof. FIG. 1 illustrates an example of a bipolar type electrostatic chucking unit. The unprocessed sample 104 is placed on the electrostatic chucking film 102. As described above, the unprocessed sample 104 is a semiconductor wafer or the like, for example.

One side of a low pass filter 106A is connected to the ESC electrode 103A, and an ESC power supply 105A is connected to the other side of the low pass filter 106A. One side of a low pass filter 106B is connected to the ESC electrode 103B, and an ESC power supply 105B is connected to the other side of the low pass filter 106B. These low pass filters 106A and 106B are so-called low pass filters (LPF).

The ESC power supply 105A serving as a first DC power supply supplies a DC voltage to the ESC electrode 103A via the low pass filter 106A. The ESC power supply 105B serving as the second DC power supply supplies a DC voltage to the ESC electrode 103B via the low pass filter 106B.

The ESC electrodes 103A and 103B are supplied with the DC voltages having different polarities, and are electrostatic chuck electrodes that electrostatically chuck the unprocessed sample 104 to the electrostatic chucking film 102 according to a potential difference between the DC voltages which have been applied to the ESC electrodes 103A and 103B in a state in which plasma 107 is not present.

In addition, a radio-frequency matcher 111 is connected to the base material section 101. A radio-frequency power supply 112 is connected to the radio-frequency matcher 111. The radio-frequency matcher 111 is configured to include a high-voltage side Vpp detector 108, a low-voltage side Vpp detector 109, and a bias matcher 110 which will be described later. The bias matcher 110 performs bias matching of the radio-frequency power to be output from the radio-frequency power supply 112.

The ESC power supply control unit 116 serving as a power supply control unit sets an output voltage value to be output from the ESC power supplies 105A and 105B on the basis of a detection result obtained by the high-voltage side Vpp detector 108 and the low-voltage side Vpp detector 109 of the radio-frequency matcher 111.

In addition, it is possible to set the output voltage to be output from the ESC power supplies 105A and 105B on the basis of the Vpp detection result according to one system by providing high and low timings in the Vpp detector (for example, only in the high-voltage side Vpp detector 108).

In addition, the radio-frequency power from the radio-frequency power supply 112 is applied, as bias power, to the base material section 101 via the bias matcher 110. The radio-frequency power supply 112 is a power supply, for example, having a frequency of about 4 MHz and output of about 1 kW to 7.5 kW.

The radio-frequency power supply 112 outputs power in a range of a TM duty (TM Duty) being about 5 to 95%, and a TM frequency being about 0.1 to 5 kHz in a TM mode. At this time, the TM duty is a ratio of a period of high bias power with respect to one cycle.

The TM mode, in other words, a TM bias alternately applies two types of radio-frequency power (bias), that is, applying a high voltage and a low voltage of the radio-frequency voltage to the unprocessed sample 104, and performs plasma etching by setting a time ratio (the TM duty) of the radio-frequency power, and a repetition frequency.

In addition, a plurality of refrigerant flow paths 113, which are flow paths in which refrigerant flows, are formed in the base material section 101. It is configured such that the temperature-controlled refrigerant flows in the refrigerant flow path 113, and accordingly, temperature of the base material section 101 is controlled.

Further, helium is supplied between the unprocessed sample 104 and the electrostatic chucking film 102 at constant pressure by the helium supply unit 114. Accordingly, heat conduction between the unprocessed sample 104 and the electrostatic chucking film 102 is increased. An etching control unit 115 is connected to the radio-frequency power supply 112, and the radio-frequency power supply 112 is controlled by the etching control unit 115.

<Disadvantage of Voltage Control Using Only Radio-frequency Voltage Vpp_H>

Here, a description will be given regarding a control technique of the output voltage of the ESC power supply which has been described so far.

In the technique which has been described so far, the output voltages ($V_A$ and $V_B$) of the two ESC power supplies are determined based on the following equation, for example, using only a monitor value of a radio-frequency voltage Vpp_H, which is the bias voltage of the high power side to be applied to the ESC electrode, and the control is performed automatically with respect to radio-frequency voltage Vpp values different depending on conditions.

[Expression 1]

Output of ESC power supply A $$V_A = V_{ESC}/2 - Vpp\_H * R_1 \quad \text{(Equation 1)}$$

Output of ESC power supply B $$V_B = -(V_{ESC}/2 + Vpp\_H * R_1) \quad \text{(Equation 2)}$$

Here, $V_{ESC}$ is a difference between the output voltage values of the two ESC power supplies 105A and 105B to be set in an etching recipe. Further, $R_1$ is a Vdc/Vpp ratio to be set in the recipe, and is usually set as about 0.3 to 0.45 from an actual measurement result in the case of continuous output (that is, the TM duty of 100%).

Incidentally, an actual potential Vw on the semiconductor wafer is calculated based on Equation 3.

[Expression 2]

Actual potential on semiconductor wafer $Vw = (V_A + V_B)/2 - Vpp\_H * R_1$ (Equation 3)

Figure 2:
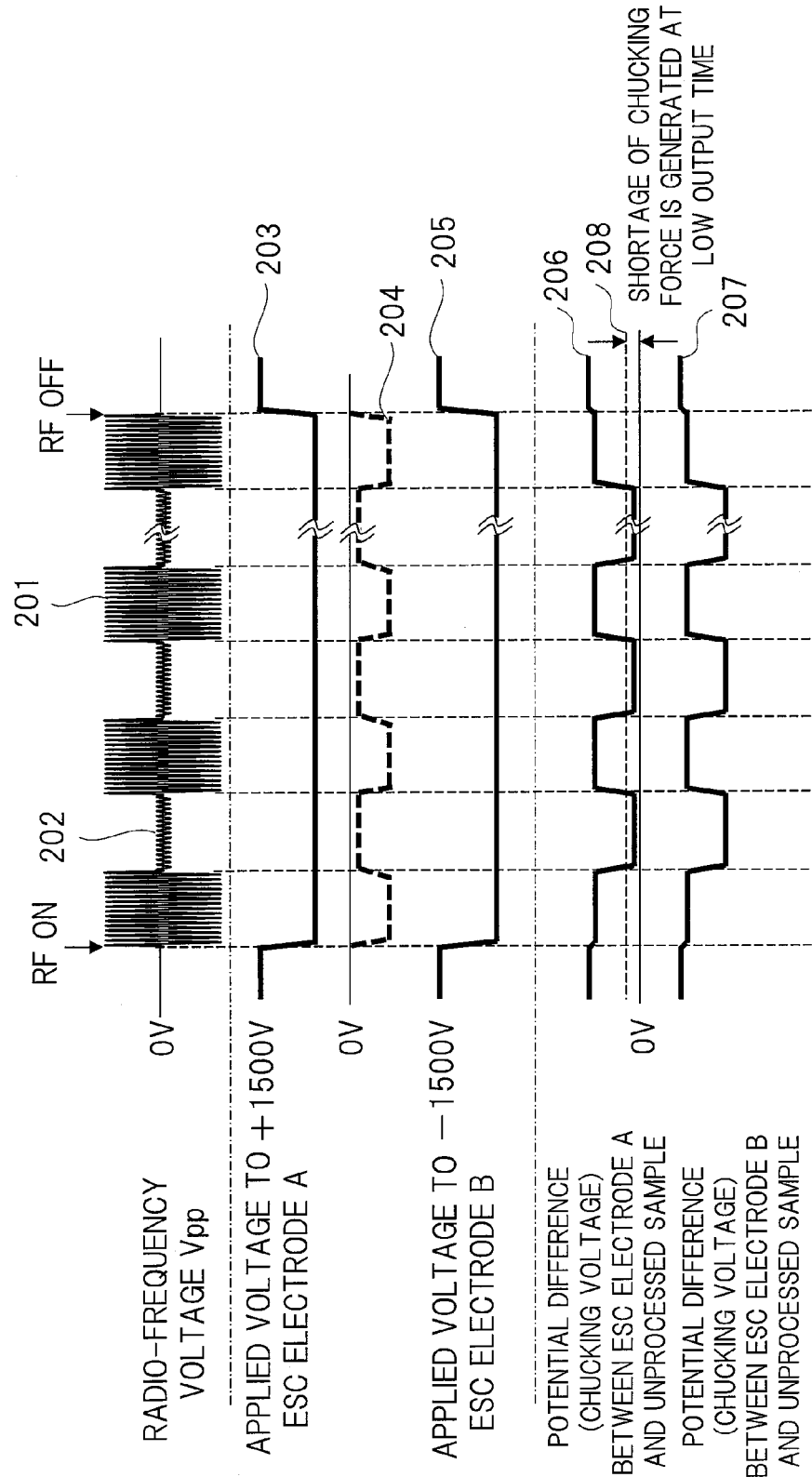
FIG. 2 is a timing chart illustrating an example of a signal of each unit of the plasma processing apparatus in which temperature control of a semiconductor wafer is difficult at the time of only using a monitor value of a radio-frequency voltage, which is a bias voltage of a high power side, to be applied to an ESC electrode examined by the present inventors.
Figure 3:
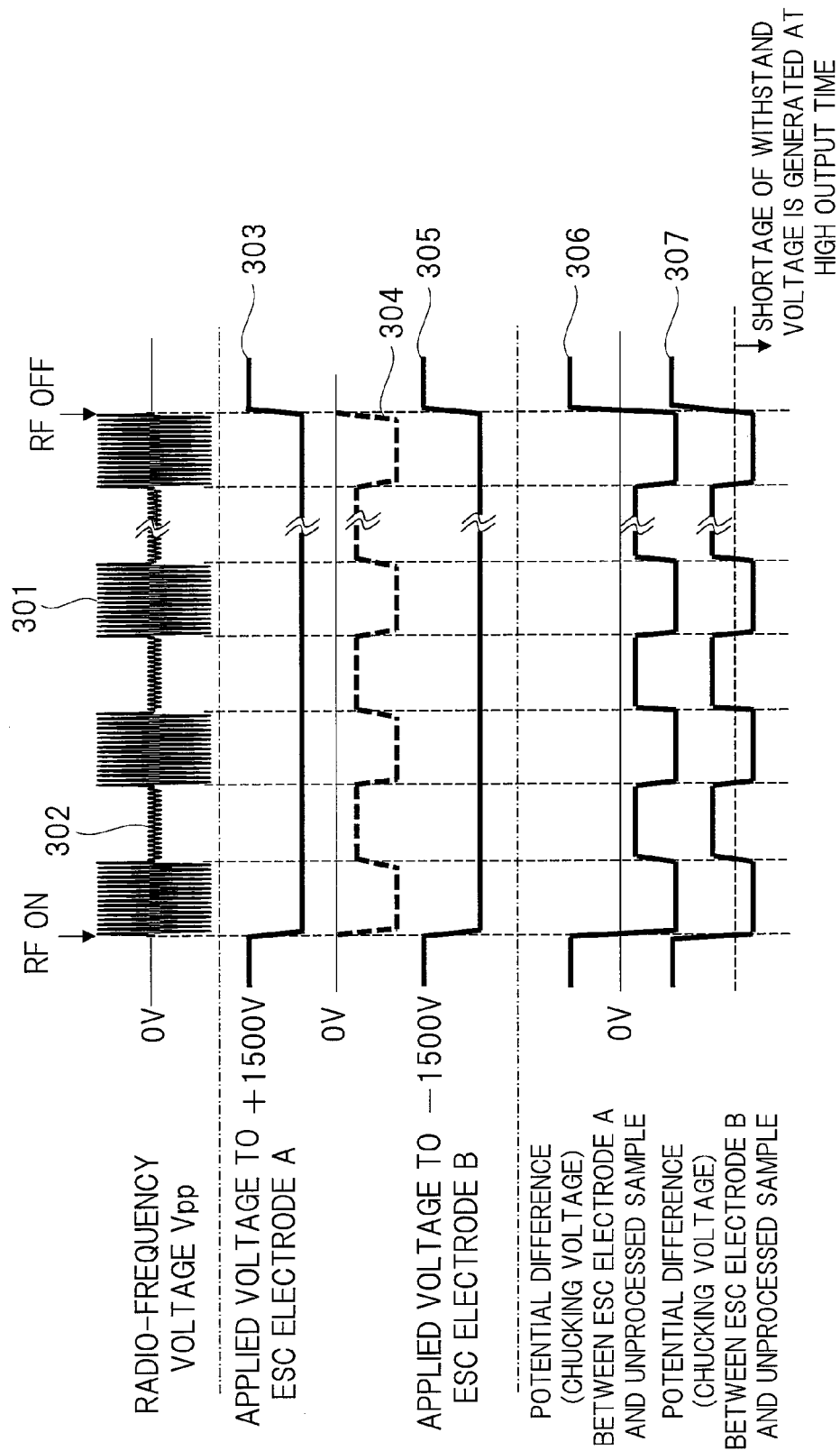
FIG. 3 is a timing chart illustrating an example of a signal of each unit of the plasma processing apparatus in which an electrostatic chucking film is dielectrically broken down at the time of only using the monitor value of the radio-frequency voltage, which is the bias voltage of the high power side, to be applied to the ESC electrode examined by the present inventors.

FIGS. 2 and 3 are timing charts of a signal of each unit of the plasma processing apparatus at the time of using only the monitor value of the radio-frequency voltage Vpp_H, which is the bias voltage of the high power side to be applied to the ESC electrode examined by the present inventors.

FIG. 2 illustrates a radio-frequency waveform 201 of a high Vpp, a radio-frequency waveform 202 of a low Vpp, an applied voltage 203 to the ESC electrode A, an applied voltage 205 to the ESC electrode B, an actual potential 204 on the semiconductor wafer, and each of potential differences 206 and 207 between each of the ESC electrodes A and B and the unprocessed sample from top to bottom.

Similarly, FIG. 3 illustrates a radio-frequency waveform 301 which is a high Vpp waveform, a radio-frequency waveform 302 which is a low Vpp waveform, an application electrode 303 to the ESC electrode A, an applied voltage 305 to the ESC electrode B, an actual potential 304 on the semiconductor wafer, and each of potential differences 306 and 307 between each of the two ESC electrodes A and B, and the unprocessed sample from top to bottom.

In addition, a measurement condition is a two-level TM condition in which a withstand voltage ($V_d$) of the electrostatic chucking film is 3000 V, and a high output is 4 kW, a low output is 200 W, the TM duty is 40%, the TM frequency is 1 kHz of etching set values, and is set to a case in which $R_1 = 0.4$ and a set value of a chucking voltage $V_{ESC} = 3000$ V.

Here, a case in which the output voltages of the ESC electrodes A and B are controlled using only the monitor voltage of Vpp_H of the high power side described above will be examined.

In this case, when a difference in the Vpp value between a high output time and a low output time becomes 2.5 kV or higher as illustrated in FIG. 2, the potential difference 206 between the ESC electrode A of the low output time and the unprocessed sample becomes lower than a required minimum chuck voltage 208 (for example, about 1 kV). Accordingly, the temperature control of the semiconductor wafer is difficult.

In addition, the potential difference 307 between the ESC electrode B and the unprocessed sample becomes higher than a dielectric withstand voltage $V_d$ of the electrostatic chucking film, and there occurs a problem that the electrostatic chucking film is dielectrically broken down in a case in which Vpp exceeds about 3333 V in a different etching condition as illustrated in FIG. 3.

<Configuration to Solve Disadvantage>

Thus, the plasma processing apparatus illustrated in FIG. 1 is configured such that the high-voltage side Vpp detector 108 and the low-voltage side Vpp detector 109 are included in the radio-frequency matcher 111 as described above. Then, the ESC power supply control unit 116 determines the output values of the ESC power supplies 105A and 105B using detection values to be detected by the high-voltage side Vpp detector 108 and the low-voltage side Vpp detector 109.

The high-voltage side Vpp detector 108 serving as a voltage detection unit detects Vpp_H which has been detected at a timing of the high-voltage side based on a trigger signal associated with the TM frequency and the TM duty output from the etching control unit 115 or the radio-frequency power supply 112, and outputs the detected Vpp_H to the ESC power supply control unit 116.

In addition, the low-voltage side Vpp detector 109 similarly serving as the voltage detection unit outputs a radio-frequency voltage Vpp_L, which is a bias voltage detected at a timing of the low-voltage side based on the trigger signal associated with the TM frequency and the TM duty output from the etching control unit 115 or the radio-frequency power supply 112, to the ESC power supply control unit 116.

Then, a time averaged radio-frequency voltage is calculated in the ESC power supply control unit 116 from Equation 4 shown as follows:

[Expression 3]

The ESC power supply control unit 116 calculates a time averaged radio-frequency voltage $Vpp$ based on $Vpp$ monitor values output from the high voltage side $Vpp$ detector 108 and the low voltage side $Vpp$ detector 109.

$$\overline{Vpp}=Vpp\_H\times D+Vpp\_L\times(1-D)=(Vpp\_H-Vpp\_L)+Vpp\_L \quad \text{(Equation 4)}$$

At this time, D is the TM duty of the TM bias. The output voltages $V_A$ and $V_B$ of the ESC power supplies 105A and 105B are calculated based on Equations 5 and 6.

[Expression 4]

$$V_A=V_{ESC}/2-\overline{Vpp}*R_1 \quad \text{(Equation 5)}$$

$$V_B=-(V_{ESC}/2+\overline{Vpp}*R_1) \quad \text{(Equation 6)}$$

In this embodiment, Vpp_L=0 (that is, the low output power of 0 W) may be substituted in Equations 5 and 6 in the case of the usual TM bias not the two-level TM.

[Expression 5]

$$V_A=V_{ESC}/2-Vpp\_H*D*R_1 \quad \text{(Equation 7)}$$

$$V_B=-(V_{ESC}/2+Vpp\_H*D*R_1) \quad \text{(Equation 8)}$$

Then, the ESC power supplies 105A and 105B are controlled by Equations 7 and 8.

A description will be given regarding signal timings of the Vpp voltage waveform, the output voltage of the ESC power supply, and further each of the potential differences between each of the ESC electrodes 103A and 103B and the unprocessed sample 104 at the time.

<Signal Timing Example of Plasma Processing Apparatus>

Figure 4:
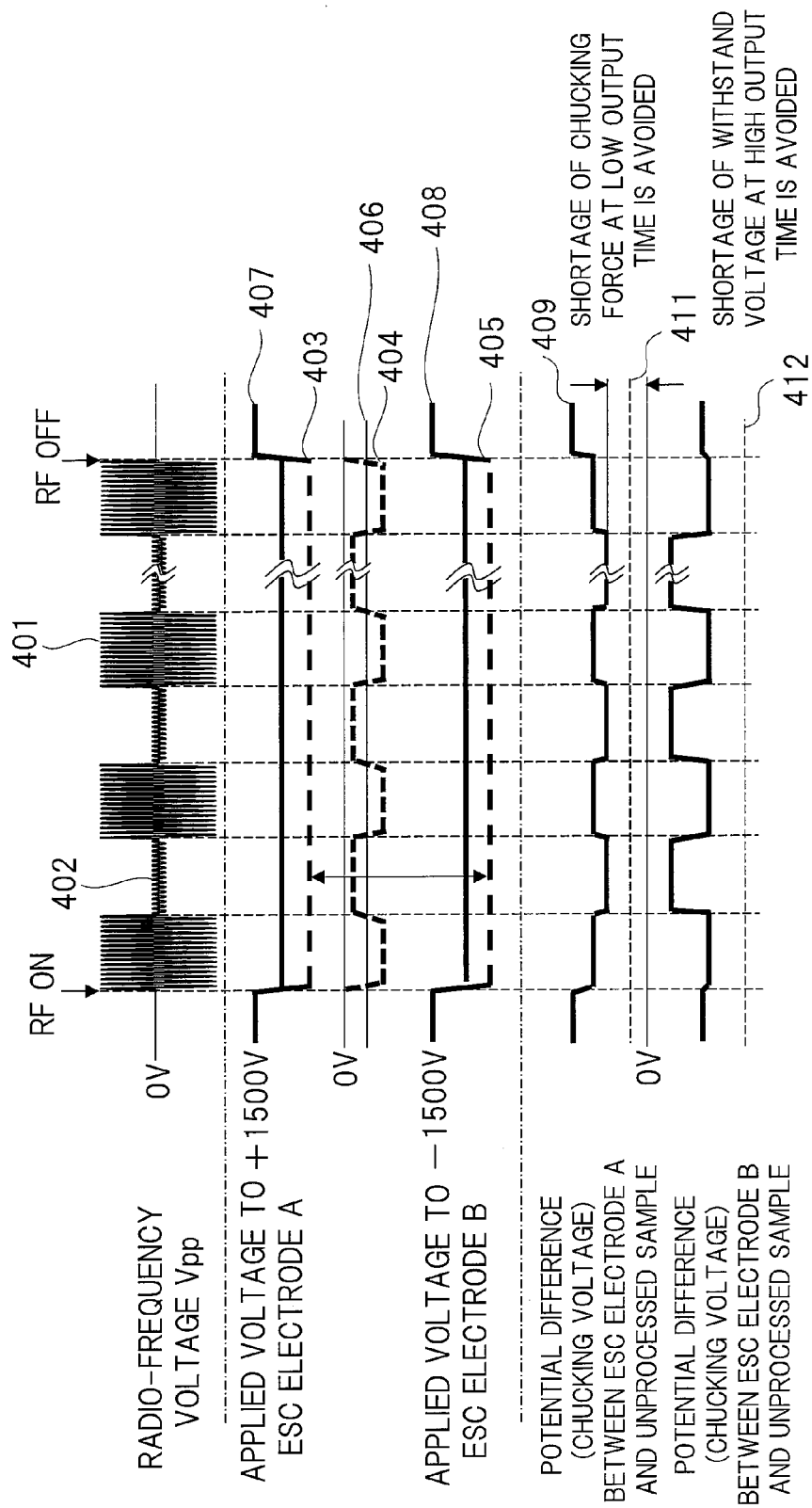
FIG. 4 is a timing chart illustrating an example of a signal timing of each unit in the plasma processing apparatus of FIG. 1.

FIG. 4 is a timing chart illustrating an example of a signal timing of each unit in the plasma processing apparatus of FIG. 1.

FIG. 4 illustrates a radio-frequency waveform 401 of the high Vpp waveform, a radio-frequency waveform 402 of the low Vpp waveform, an applied voltage 403 to the ESC electrode A, an actual potential 404 on the semiconductor wafer, an applied voltage 405 to the ESC electrode B, and each of potential differences 411 and 412 between each of the ESC electrodes A and B and the unprocessed sample from top to bottom.

In the case of the plasma processing apparatus of FIG. 1, the ESC power supply control unit 116 calculates a time averaged value 406 of the potentials on the unprocessed sample 104 of the high output time and the low output time using Equation 4, and controls an output voltage 407 of the ESC power supply 105A and an output voltage 408 of the ESC power supply 105B based on the calculated value. Here, the above-described high output time is a first period, and the low output time is a second period.

According to this control, the potential difference 409 between the ESC electrode 103A and the unprocessed sample 104 can be shifted in a direction in which a chucking force increases. Further, it is also possible to control a dielectric withstand voltage of a voltage difference $V_B$ side between the ESC electrode 103B and the unprocessed sample 104 at the low voltage time to be equal to or lower than the dielectric withstand voltage 412 of the electrostatic chucking film.

In this manner, control equations shown in Equations 5 to 8 can take the TM duty of the TM bias set in the recipe automatically as an average value of Vpp as compared to the conventional calculation. Further, it is possible to widen a region that allows securement of the chucking force and avoidance of the breakdown of the electrostatic chucking film 102.

The region that allows securement of the chucking force and securement of the dielectric withstand voltage is more narrowed when a difference between Vpp_H and Vpp_L in the TM bias configured of the high Vpp and the low Vpp increases more.

<Control Operation Example of ESC Power Supply Control Unit Included in Plasma Processing Apparatus>

Figure 5:
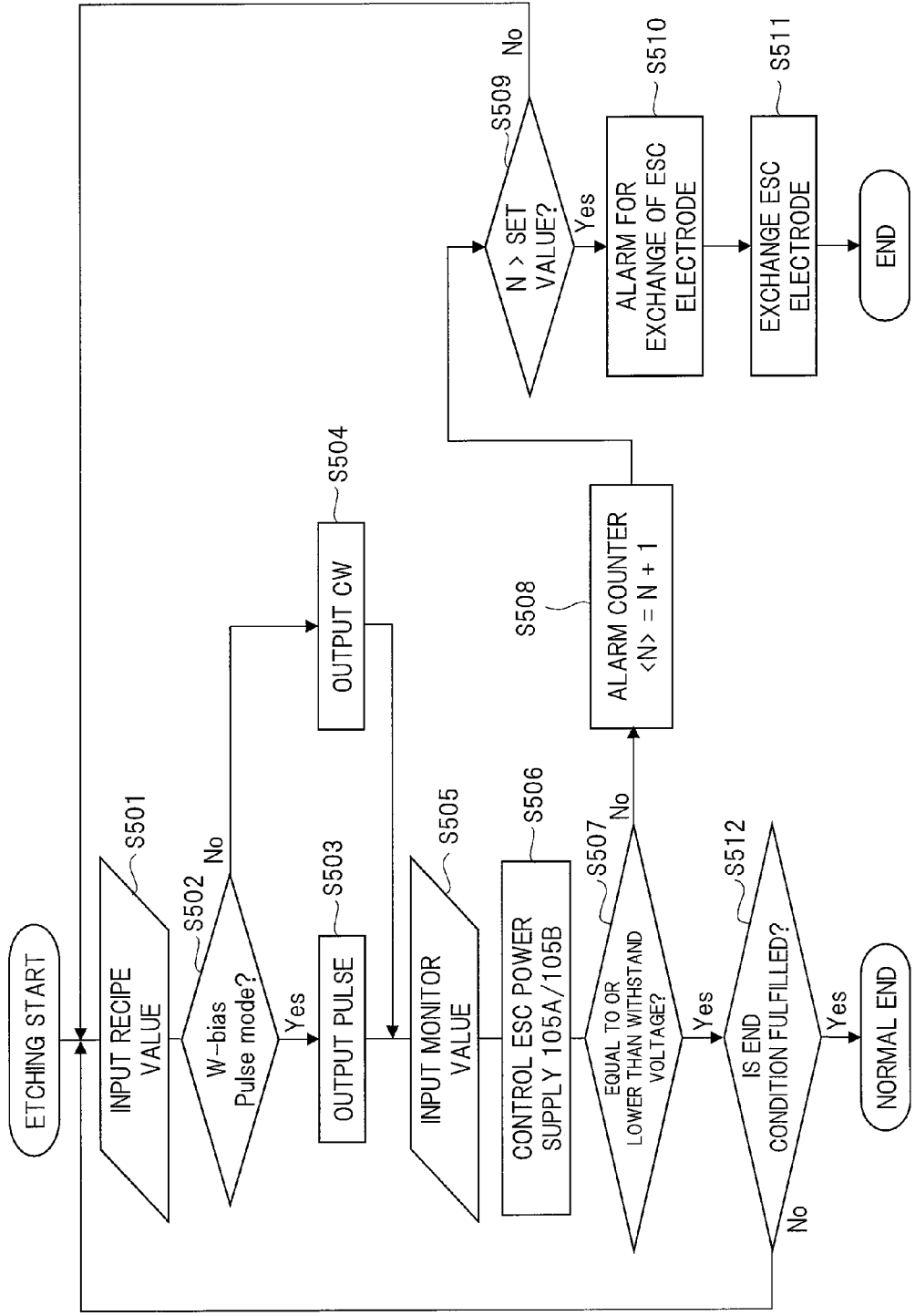
FIG. 5 is a flowchart illustrating an example of a control operation during an etching process performed by an ESC power supply control unit which is included in the plasma processing apparatus of FIG. 1.

FIG. 5 is a flowchart illustrating an example of a control operation during an etching process performed by the ESC power supply control unit 116 which is included in the plasma processing apparatus of FIG. 1.

First, when the unprocessed sample 104 is placed on the unprocessed sample installation unit 100, microwave is supplied to the processing chamber, and helium gas is supplied inside the processing chamber by the helium supply unit 114. Then, pressure inside the processing chamber is controlled to a predetermined pressure, and the highly dense plasma 107 illustrated in FIG. 1 is generated in the processing chamber by interaction between the microwave supplied inside the processing chamber and a static magnetic field generated by a solenoid coil (not illustrated).

When etching is started (Step S501), the etching control unit 115 determines whether an output mode of the radio-frequency power supply 112 described in the etching recipe is the TM bias or the CW (continuous wave) bias (Step S502), and performs output in the mode according to the determination result (Steps S503 and S504).

Monitor values Vpp_H and Vpp_L, which have been detected by the high-voltage side Vpp detector 108 and the low-voltage side Vpp detector 109, are input to the ESC power supply control unit 116 while the etching process is implemented as the plasma is ignited and the radio-frequency power supply 112 is output according to the set value (Step S505).

Subsequently, the ESC power supplies 105A and 105B are controlled so as to output voltages corresponding to the output voltages $V_A$ and $V_B$ calculated based on Equations 5 and 6 described above (Step S506). Further, the following determination is performed with respect to the calculated values of the output voltages $V_A$ and $V_B$ (Step S507).

[Expression 6]

$$V_d > |(V_A) + Vpp\_H * R_2 H| \quad \text{(Equation 9)}$$

$$V_d > |(V_B) + Vpp\_H * R_2 H| \quad \text{(Equation 10)}$$

$$V_d > |(V_A) + Vpp\_L * R_2 L| \quad \text{(Equation 11)}$$

$$V_d > (V_B) + Vpp\_L * R_2 L| \quad \text{(Equation 12)}$$

Here, $V_d$ is a withstand voltage use upper-limit threshold value (V) of the electrostatic chucking film, $R_2H$ is an actual Vdc/Vpp ratio at the high output time, and $R_2L$ is a Vdc/Vpp ratio at the low output time.

Equation 9 represents a potential difference between the ESC electrode 103A, which is a + side electrode at the high output time, and the unprocessed sample 104. Equation 10 represents a potential difference between the ESC electrode 103B, which is a − side electrode at the high output time, and the unprocessed sample 104.

Equation 11 represents a potential difference between the ESC electrode 103A, which is the + side electrode at the low output time, and the unprocessed sample 104. Equation 12 represents a potential difference between the ESC electrode 103B, which is the − side electrode at the low output time, and the unprocessed sample 104.

The ESC power supply control unit 116 continues the etching process in a case in which each voltage is smaller than the withstand voltage use upper-limit threshold value of the electrostatic chucking film (Step S512), and generates alarm and increases an alarm counter by +1 in a case in which each voltage is larger than that (Step S508).

Then, in a case in which the number of times of exceeding the withstand voltage use upper-limit threshold value of the electrostatic chucking film exceeds a threshold value of the number of times set in advance (Step S509), the alarm for exchange of the ESC electrode is output (Step S510).

In a case in which the alarm for exchange of the ESC electrode is output, the exchange of the ESC electrode is implemented after the etching process ends (Step S511). Here, the threshold value of the number of times is stored in a memory (not illustrated) or the like that is included in the ESC power supply control unit 116, for example.

$R_2H$ and $R_2L$ are functions depending on the Vpp voltages of the high output time and the low output time in Equations 9 to 12. Although $R_2H$ and $R_2L$ are desirably used from a database obtained from actual measurement by performing experiments in advance, but may be substituted by the recipe set value $R_1$ and the like.

In the case of the usual TM bias other than the two-level at the time, $R_2$ of Equations 9 to 12 may be considered substantially as 0, and may be simplified and used as follows:

[Expression 7]

$$V_d > |(V_A) + Vpp\_H * R_1| \quad \text{(Equation 13)}$$

$$V_d > |(V_B) + Vpp\_H * R_1| \quad \text{(Equation 14)}$$

$$V_d > |(V_A)| \quad \text{(Equation 15)}$$

$$V_d > |(V_B)| \quad \text{(Equation 16)}$$

Example 1

For example, it is considered a case in which Vpp_H=4000 V and Vpp_L=0 V are monitored with respect to the recipe set values of $V_{ESC}$=3000 V, $R_1$=0.45 and D=80% while using the ESC electrode having the threshold value $V_d$=3000 V.

A voltage of the ESC at the high voltage time is that a voltage of ECS (+) is 60 V from Equation 7, a voltage of ESC(−) is −2940 V from Equation 8, and a voltage at the high voltage time of the TM bias is −1800 V from Equation 3 of the CW time. Further, a voltage between the ESC electrode at the high voltage time and the unprocessed sample is |1860/1140 V|, and a voltage between the ESC electrode at the low voltage time and the unprocessed sample is |60/2940 V| from Equations 9 and 10, so that the voltage goes below the threshold value $V_d$, and thus, does not cause an error to restrict the use, that is, a withstand voltage failure of the electrostatic chucking film.

When Vpp=5000 V, however, a voltage between the ESC electrode at the high voltage time and the unprocessed sample is |1950/1050 V|, and a voltage between the ESC electrode at the low voltage time and the unprocessed sample is |300/3300 V| from Equations 9 and 10. Accordingly, the voltage exceeds the upper limit of the threshold value $V_d$ of the − side ESC electrode at the low voltage time, which causes the error to restrict the use.

In addition, although the example of performing the control by also detecting Vpp_L has been illustrated in this embodiment, Vpp_L=0 may be substituted in Equations 5 and 6 in a case in which the low-voltage side Vpp detector 109 is not provided.

[Expression 8]

$$V_A = V_{ESC}/2 - Vpp * D * R_1 \quad \text{(Equation 17)}$$

$$V_B = -(V_{ESC}/2 + Vpp * D * R_1) \quad \text{(Equation 18)}$$

Here, $Vpp = Vpp\_H$

In such a manner, the ESC power supplies 105A and 105B are controlled using both Equations 17 and 18, and accordingly, it is possible to avoid the breakdown of the electrostatic chucking film 102 while maintaining a sufficient chucking force.

Example 2

Figure 6:
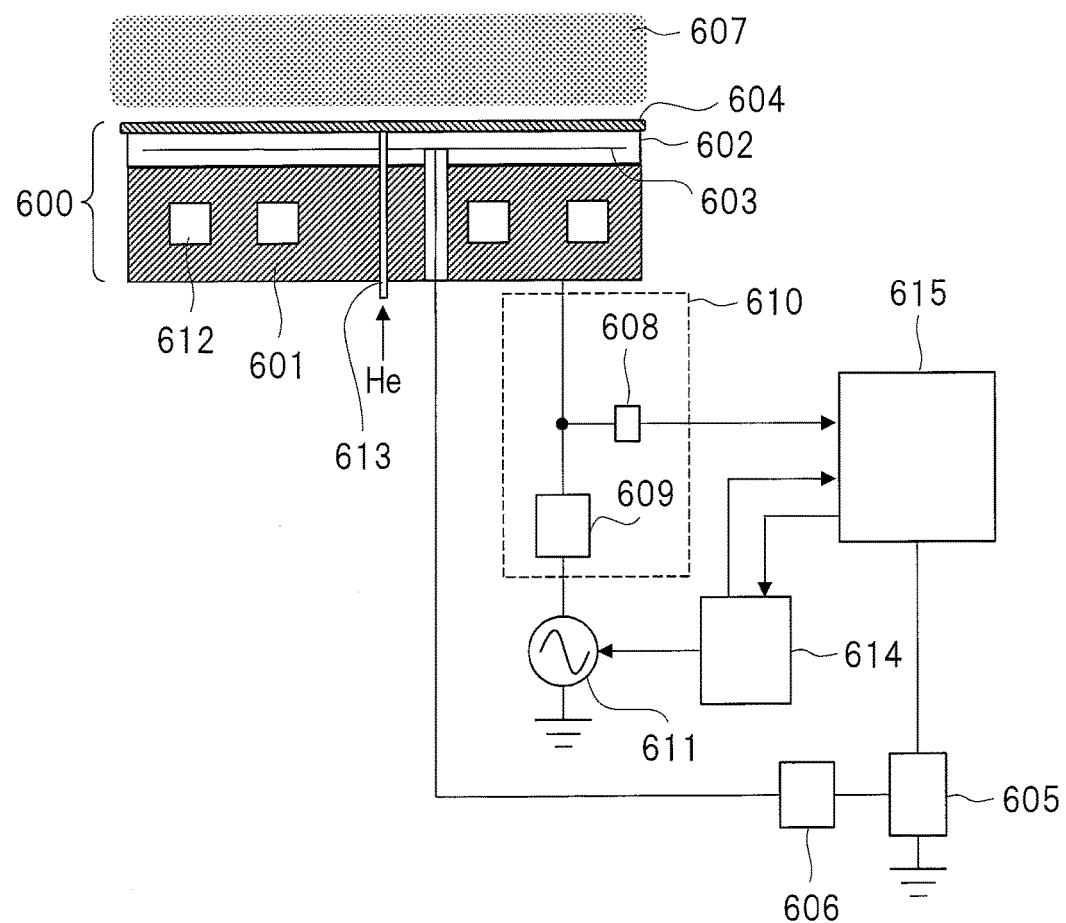
FIG. 6 is an explanatory diagram illustrating an example of a configuration of a main section in a plasma processing apparatus using a unipolar type electrode according to an embodiment.

In addition, although the example regarding the bipolar type electrode has been illustrated in the above-described mode of Example 1, the application to the unipolar type electrode is also possible. FIG. 6 is an explanatory diagram illustrating another example of the configuration of the main section in the plasma processing apparatus of FIG. 1.

In FIG. 6, an unprocessed sample installation unit 600 includes a base material section 601, an electrostatic chucking film 602, and an ESC electrode 603. The electrostatic chucking film 602 is placed on an upper part of the base material section 601 to which radio-frequency power is applied.

The electrostatic chucking film 602 is formed using ceramic, for example. In addition, the ESC electrode 603 is embedded in the electrostatic chucking film 602. A low pass filter 606 is connected to the ESC electrode 603, and an ESC power supply 605 is connected to the low pass filter 606.

The ESC power supply 605 serving as the DC power supply supplies a DC voltage to the ESC electrode 603 via the low pass filter 606.

In addition, a radio-frequency matcher 610 is connected to the base material section 601. A radio-frequency power supply 611 is connected to the radio-frequency matcher 610. The radio-frequency matcher 610 is configured to include a Vpp detector 608 and a bias matcher 609. The bias matcher 609 performs bias matching of the radio-frequency power to be output from the radio-frequency power supply 611.

The ESC power supply control unit 615 serving as the power supply control unit sets an output voltage value to be output from the ESC power supply 605 on the basis of a detection result obtained by the Vpp detector 608 of the radio-frequency matcher 610. It is possible to perform the calculation by substituting an output V of the ESC power supply in Equation 7, but the calculation is performed by substituting a value $V_{ESC}$ therein directly without dividing the value into two since a set value of the chucking voltage of the unipolar type electrode is unipolar. That is, it is possible to perform the calculation based on Equation 19.

[Expression 9]

$$V_A = -(V_{ESC} + Vpp\_H * D * R_1) \quad \text{(Equation 19)}$$

Subsequently, the ESC power supply 605 is controlled so as to output a voltage corresponding to $V_A$ calculated based on Equation 19 described above. Further, the following determination is performed with respect to the calculated value $V_A$.

[Expression 10]

$$V_d > |(V_A) + Vpp\_H * R_2 H| \quad \text{(Equation 20)}$$

$$V_d > |(V_A) + Vpp\_L * R_2 L| \quad \text{(Equation 21)}$$

Here, $V_d$ is a withstand voltage use upper-limit threshold value (V) of the electrostatic chucking film, $R_2H$ is an actual Vdc/Vpp ratio at the high output time, and $R_2L$ is a Vdc/Vpp ratio at the low output time.

Equation 20 represents a potential difference between the ESC electrode 603 at the high output time and an unprocessed sample 604.

Equation 21 represents a potential difference between the ESC electrode 603 at the low output time and the unprocessed sample 604.

$R_2H$ and $R_2L$ are functions depending on the Vpp voltages of the high output time and the low output time in Equations 20 and 21. Although $R_2H$ and $R_2L$ are desirably used from a database obtained from actual measurement by performing experiments in advance, but may be substituted by the recipe set value $R_1$ and the like.

In the case of the usual TM bias other than the two-level at the time, $R_2$ of Equations 20 and 21 may be considered substantially as 0, and may be simplified and used as follows:

[Expression 11]

$$V_d > |(V_A) + Vpp\_H * R_1| \quad \text{(Equation 22)}$$

$$V_d > |(V_A)| \quad \text{(Equation 23)}$$

For example, it is considered a case in which Vpp_H=400 V and Vpp_L=0 V are monitored with respect to the recipe set values of $V_{Esc}$=500 V, $R_1$=0.45 and D=80% while using the ESC electrode having the threshold value $V_d$=1000 V. A voltage of the ESC at the high voltage time is that a voltage of the ESC is −644 V from Equation 19 and a voltage at the high voltage time of the TM bias is −180 V from Equation 3 of the CW time. A voltage between the ESC electrode at the low voltage time and the unprocessed sample is 464 V|, so that the voltage goes below the threshold value $V_d$, and thus, does not cause an error to restrict the use, that is, a withstand voltage failure of the electrostatic chucking film.

When Vpp=2500 V, however, a voltage between the ESC electrode at the high voltage time and the unprocessed sample is |275 V|, and a voltage between the ESC electrode at the low voltage time and the unprocessed sample is |1400 V|. Accordingly, the voltage exceeds the upper limit of the threshold value $V_d$ of the ESC electrode at the low voltage time, which causes the error to restrict the use.

In addition, the flowchart of the example of the control operation during the etching illustrated in FIG. 5 can be applied in the same manner.

As above, it is possible to stably control the temperature of the sample during the plasma-processing while preventing the breakdown of the electrostatic chucking film 602 and securing the electrostatic chucking force of the sample. Accordingly, it is possible to realize the plasma processing apparatus to perform the plasma processing with high quality.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is not limited to the foregoing embodiments and but includes various modification examples. For example, the above-described embodiment concretely described the present invention so that the present invention can be easily understood, and thus the present invention is not necessarily limited to the one including all the configurations described in the foregoing.

Part of the configuration of a certain embodiment can be replaced by the configuration of another embodiment, and the configuration of the other embodiment can be added to the configuration of the certain embodiment. Moreover, part of the configuration of the embodiment can be subjected to addition/deletion/replacement of other configurations.

For example, it is possible to allow the automatic follow-up during the plasma processing by setting an initial value of $V_A$, an initial value of $V_B$, $R_1$ and a potential difference between $V_A$ and $V_B$ as parameters to the recipe in the above-described case of Example 1.

In addition, it is possible to allow the automatic follow-up during the plasma processing by setting an initial value of $V_{ESC}$, $R_1$ and a potential difference between both ends of the electrostatic chucking film as parameters to the recipe in the above-described case of Example 2.

What is claimed is:

1. A plasma processing method of performing plasma etching of a sample placed on a sample stage while time-modulated radio-frequency power is supplied to the sample stage, the sample stage being provided with a first electrode and a second electrode which cause the sample to be electrostatically chucked to an electrostatic chucking film, the method comprising:

applying a first DC voltage to the first electrode;
applying a second DC voltage to the second electrode;
obtaining a time averaged value of a peak-to-peak voltage value of a radio-frequency voltage applied to the sample stage based on a first voltage value, a second voltage value, and a duty ratio of the time modulation;
obtaining the first DC voltage and the second DC voltage by using the obtained time averaged value and a potential difference between the first DC voltage set in advance and the second DC voltage set in advance; and
applying the obtained first DC voltage and the obtained second DC voltage to the first electrode and the second electrode, respectively,
wherein the first voltage value is a peak-to-peak voltage value of the radio-frequency voltage in a first period of the time-modulated radio-frequency power,
the second voltage value is a peak-to-peak voltage value of the radio-frequency voltage in a second period of the time-modulated radio-frequency power, and
an amplitude of the first period is larger than an amplitude of the second period.

2. The plasma processing method according to claim 1, wherein the obtained first DC voltage and the obtained second DC voltage are sequentially obtained during the plasma processing, and the sequentially obtained first DC voltage and the sequentially obtained second DC voltage are respectively applied to the first electrode and the second electrode.

3. The plasma processing method according to claim 1, wherein parameters, which are set in a plasma processing condition to define a condition of the plasma etching, include an initial value of the first DC voltage, an initial value of the second DC voltage, a ratio of a self-bias voltage to be applied to the sample stage with respect to the peak-to-peak voltage value of the radio-frequency voltage, and a potential difference between the initial value of the first DC voltage and the initial value of the second DC voltage.

4. The plasma processing method according to claim 1, further comprising:
determining whether a voltage, which is equal to or exceeds an upper limit of a dielectric withstand voltage of the electrostatic chucking film, is applied to the electrostatic chucking film; and
outputting an alarm that promotes exchange of the electrostatic chucking film when the number of times of determining that a voltage equal to or exceeding the upper limit of the dielectric withstand voltage is applied to the electrostatic chucking film exceeds a threshold value of the number of determinations set in advance.

5. The plasma processing method according to claim 4, further comprising:
obtaining a first potential difference between the first electrode and the sample and a second potential difference between the second electrode and the sample based on the first DC voltage and the second DC voltage; and
determining that the voltage equal to or exceeding the upper limit of the dielectric withstand voltage is applied to the electrostatic chucking film when the obtained first potential difference and the obtained second potential difference is equal to or exceeds an upper-limit threshold value of the dielectric withstand voltage set in advance.

6. A plasma processing method of performing plasma etching of a sample placed on a sample stage while time-modulated radio-frequency power is supplied to the sample stage, the sample stage being provided with an electrode which causes the sample to be electrostatically chucked to an electrostatic chucking film, the method comprising:

applying a DC voltage to the electrode;
obtaining a time averaged value of a peak-to-peak voltage value of a radio-frequency voltage applied to the sample stage based on a first voltage value, a second voltage value, and a duty ratio of the time modulation;
obtaining the DC voltage by using the obtained time averaged value and the DC voltage set in advance; and
applying the obtained DC voltage to the electrode,
wherein the first voltage value is a peak-to-peak voltage value of the radio-frequency voltage in a first period of the time-modulated radio-frequency power,
the second voltage value is a peak-to-peak voltage value of the radio-frequency voltage in a second period of the time-modulated radio-frequency power, and
an amplitude of the first period is larger than an amplitude of the second period.

* * * * *